(12) United States Patent
Muftuler et al.

(10) Patent No.: US 7,362,101 B2
(45) Date of Patent: Apr. 22, 2008

(54) SENSE OPTIMIZED MRI RF COIL DESIGNED WITH A TARGET FIELD METHOD

(75) Inventors: Lutfi Muftuler, Aliso Viejo, CA (US); Gang Chen, Irvine, CA (US); Orhan Nalcioglu, Laguna Beach, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 11/411,257

(22) Filed: Apr. 25, 2006

(65) Prior Publication Data
US 2006/0244449 A1 Nov. 2, 2006

Related U.S. Application Data

(60) Provisional application No. 60/675,356, filed on Apr. 27, 2005.

(51) Int. Cl.
*G01V 3/00* (2006.01)
*B23P 17/04* (2006.01)
*H01F 7/06* (2006.01)

(52) U.S. Cl. .................. 324/318; 29/592; 29/602.1; 29/605

(58) Field of Classification Search ........ 324/300–322; 333/219–235; 343/724, 787, 907–908, 592–593, 343/602.1, 605–609; 29/592–593, 602.1, 29/605–609
See application file for complete search history.

(56) References Cited

U.S. PATENT DOCUMENTS

| 4,783,641 | A | * | 11/1988 | Hayes et al. ............... 333/219 |
| 5,602,479 | A | * | 2/1997 | Srinivasan et al. ......... 324/318 |
| 5,680,047 | A | * | 10/1997 | Srinivasan et al. ......... 324/318 |
| 6,029,082 | A | * | 2/2000 | Srinivasan et al. ......... 600/422 |
| 6,344,745 | B1 | * | 2/2002 | Reisker et al. ............. 324/318 |
| 6,825,660 | B2 | * | 11/2004 | Boskamp .................... 324/318 |
| 6,831,460 | B2 | * | 12/2004 | Reisker et al. ............. 324/318 |

* cited by examiner

*Primary Examiner*—Brij Shrivastav
*Assistant Examiner*—Dixomara Vargas
(74) *Attorney, Agent, or Firm*—Myers Dawes Andras & Sherman LLP

(57) ABSTRACT

An MRI RF coil that is optimized for SENSE imaging is used in a method where the surface current density distribution on a coil former was calculated to maximize the $SNR_{sense}$ within a volume of interest. An analytic relationship was formulated between the $SNR_{sense}$ and surface current density on the coil former. The SNR at pixel ρ in a SENSE-MR image, $SNR_{sense,\rho}$, is inversely proportional to the g-factor. The g-factor was formulated in terms of the B1 distribution of the coils. By specifying the geometry of the desired coil former and using a finite element mesh, the surface current distribution was calculated to maximize the $SNR_{sense}$, by minimizing $(1/SNR_{sense})$ in the volume of interest using a least squares procedure. A simple two-coil array was tested and phantom images were collected. The results show that the new coil design method yielded better uniformity and SNR compared to standard coils.

18 Claims, 11 Drawing Sheets

SENSE OPTIMIZED MRI RF COIL DESIGNED WITH A TARGET FIELD METHOD

RELATED APPLICATIONS

The present application is related to U.S. Provisional Patent Application, Ser. No. 60/675,356, filed on Apr. 27, 2005, which is incorporated herein by reference and to which priority is claimed pursuant to 35 USC 119.

BACKGROUND OF THE INVENTION

1. Field of the Invention

The invention relates to the field of magnetic resonance imaging (MRI) and in particular to optimization of MRI RF sense coil designs for the best signal to noise ratios given a volume of interest and a surface shape on which the coil is to be formed.

2. Description of the Prior Art

Parallel imaging methods have been recently introduced in MRI that allows faster data acquisition using distinct information coming from an array of RF coils. One of these techniques is known as SMASH (Simultaneous Acquisition of Spatial Harmonics). In SMASH a sparsely sampled k-space is collected in the phase encode direction, thus reducing the total image collection time. However, this will cause aliasing in the resulting image. The space between the collected k-space lines are synthesized by forming appropriate linear combinations of the separate information coming from a spatially distributed coil array. This generates gradient induced sinusoidal modulations in the phase encoding direction, thus getting rid of aliasing and obtaining high spatial resolution.

Another popular technique, introduced by Pruessmann et al is known as SENSE (Sensitivity Encoding) imaging. This method also collects a subset of the k-space, but correction is done in image space, instead of synthesizing the k-space lines. Each coil in an array has a different sensitivity to pixels inside the imaging volume. This information is used to decouple separate pixels in overlapping areas inside an aliased image.

Due to non-uniform B1 (RF) field distributions with these coil arrays, the spatial distribution of the signal to noise ratio (SNR) in the images is not uniform. The coil configuration can be optimized to achieve best SNR in the regions of interest. Relative noise images derived from the SENSE theory can be studied to find the optimum coil configuration to minimize noise in the target volume of interest (VOI). These noise images are derived from the coil geometry and reduction factor and they indicate the spatial distribution of relative SNR variations within the imaging volume. The SNR at the pixel location $\rho$ is given by the equation $$SNR_{sense,\rho} = SNR_{full,\rho} / (i\, g_\rho \cdot \sqrt{R}) \quad (1)$$

In equation (1), $SNR_{sense,\rho}$ and $SNR_{full,\rho}$ represent SNR at pixel location $\rho$ in reduced and full k-space acquisition cases, respectively. Here, $g_\rho$ is the geometry factor (g-factor) and R is the reduction factor. The geometry factor is determined by the coil configuration and will have a non-uniform distribution inside the imaging volume. Therefore, image noise will also be nonuniformly distributed in the images.

Several groups have attempted to design SENSE optimized coils by taking several coil array configurations and then simulating which topography yielded the smallest g-factor that resulted in the best SNR in a target volume. Weiger et al, and Zwart et al attempted to find optimized SENSE coils by simulating various predefined coil topographies. Similarly, Liffers et al attempted to find optimum phased array coil design for carotid artery imaging by simulating various known coil structures. This approach is restricted by the limited number of coils simulated, and the result will most likely not be the most optimum.

Recently, Dodd et al proposed using simulated annealing to optimize array coil performance. They have designed a four-coil array to demonstrate the method. In this technique, the algorithm starts with a standard rectangular four-coil design and the position of the wires are moved on the surface of the coil former based on a Monte-Carlo type approach. The structure that yields the best SNR is picked as the optimum design. Although this approach may yield a better design compared to other prior approaches, it still has limited scope because the basic design shape still conforms to rectangular geometry and the size of each coil loop is changed to optimize the design.

Coil optimization for particular applications can be achieved by specifying a B1 distribution within a VOI and solving the inverse problem to find the current distribution that will generate the desired field profile. For example, the time-harmonic inverse method was used by Lawrence et al to design an open head and neck RF coil. In this method, current density on the surface of a selected coil former is defined in terms of a set of basis functions and the magnetic field inside the coil geometry is calculated. Then the inverse problem is solved to obtain a current density distribution that would yield a uniform B1 field inside the coil volume. Later, Xu et al used a similar approach to generate de-emphasized B1 fields inside an unloaded RF coil that would compensate the B1 field nonuniformities caused by the dielectric resonance effects in high magnetic field MRI systems.

In the past, MRI designers have used general-purpose MRI RF coil structures, which were not optimized for accelerated SENSE imaging technique. In sensitivity encoding (SENSE), the effects of inhomogeneous spatial sensitivity of surface coils are utilized for signal localization in addition to common Fourier encoding using magnetic field gradients. Unlike standard Fourier MRI, SENSE images exhibit an inhomogeneous noise distribution, which crucially depends on the geometrical sensitivity relations of the coils used.

In conventional magnetic resonance imaging (MRI), receiver coil arrays are frequently used for the purpose of increasing the signal-to-noise-ratio (SNR). However, parallel signal acquisition with multiple coil elements may be utilized for enhancing imaging speed. Based on knowledge of coil sensitivity, the SENSitivity Encoding technique (SENSE) enables considerable scan time reduction in most currently used MRI techniques. In this method, simultaneously operated coils with inhomogeneous spatial sensitivity are utilized not only for improving base SNR but also for spatial signal encoding complementary to common gradient switching. As a consequence of this additional role of coil sensitivity, SENSE imaging entails specific criteria for the design of coil arrays.

The key goal of MRI coil design is image SNR. In the standard Fourier mode, the use of multiple receiver coils results in enhanced base SNR, varying in the image domain according to the inhomogeneity of net sensitivity. Sensitivity-based reconstruction introduces further spatial variation of SNR. In addition to the common signal intensity variations, local noise enhancement occurs to varying degrees according to the conditioning of the sensitivity based reconstruction steps. Depending strongly on the geometry of the used coil arrangement, this effect has been quantitatively described by the local geometry factor g.

The distribution of g within the desired field-of-view (FOV) directly reflects the specific role of the coil configuration in sensitivity-based reconstruction. Describing the suitability of a coil setup for sensitivity-encoded imaging, it forms the appropriate additional design criterion for SENSE arrays. The geometry factor is a mathematical function of the coil sensitivities and the reduction factor R. However, its structure does not permit straightforward analytical coil optimization, making simulations an indispensable tool in seeking optimized coil arrangements for sensitivity encoding.

Therefore, the signal-to-noise ratio (SNR) was not maximized for SENSitivity Encoding technique (SENSE). Several researchers have tested several basic RF coil designs and among the limited number of units tested, they picked the one with best performance. But none of the designs that were tested had been designed to minimize the geometry factor g of parallel imaging technique to maximize the signal-to-noise ratio. Therefore, this approach does not guarantee the best possible performance among all possible coil designs.

The target field approach was proposed by Turner, "*A target field approach to optimal coil design*", J. Phys. D: Appl. Phys., vol. 19, pp. L147-L151, (1986) to design MRI gradient coils. Later, Pissanetzky "*Minimum Energy MRI gradient coils of general geometry*", Meas. Sci. Technol., vol. 3, pp. 667-673, (1992) outlined a method that included energy minimization in target field based gradient coil design. In this method, a target magnetic field distribution is specified by the designer and the surface current distribution is calculated to achieve the desired target field. Typically, the surface current distribution on a predefined surface (coil former) is calculated by using a least squares procedure to minimize the difference between the user-defined target field and the field generated by the calculated current distribution.

BRIEF SUMMARY OF THE INVENTION

The method of the illustrated embodiment solves the inverse problem from that described above in the prior art, where the best coil topography is calculated based on the performance criteria specified by the designer. Prior art uses basic coil geometries, such as circular or rectangular forms, whereas the coil structure of the illustrated embodiment can assume any arbitrary shape to get the best performance. The coil design criteria of the illustrated embodiment begins with finding the current distribution on a prescribed or predetermined three or two dimensional surface that will maximize the signal-to-noise within the volume of interest. Therefore, the outcome will be the highest possible SNR among all possible coil designs.

The illustrated embodiment of the invention will be used as a probe to image different body parts inside an MRI scanner. Although it can be used for standard imaging techniques, its advantages will be maximally utilized with parallel imaging techniques that are employed to accelerate image data collection without sacrificing spatial resolution.

The illustrated embodiment of the invention can be used as an integral part of any MRI scanner and can be commercially sold as a standard or optional part for MRI systems.

It must be noted that even though this method is developed to optimize the performance (maximum SNR) for accelerated SENSE imaging in MRI applications, the idea can also be used to design general-purpose MRI probes to achieve maximum sensitivity in a target volume. Unlike the standard approach, the illustrated method solves the inverse problem where the B1 field is calculated to maximize signal-to-noise ratio (SNR) within a target volume given that the sense coil is defined in or on a predetermined surface or a coil former. The B1 field is the information bearing signal in the MRI scan. Then, a finite element mesh is defined on a coil frame of reference for the predetermined surface and the surface current density is calculated to generate the desired B1 field within the volume of interest (VOI).

Characterized in other words the illustrated embodiment is a methodology for design of radiofrequency probes, which is used to collect signals in a magnetic resonance imaging (MRI) scanner. It is specifically designed for optimizing the signal-to-noise ratio within a target volume in an accelerated imaging technique called SENSE imaging, although it is expressly contemplated that conventional or nonaccelerated imaging techniques also can utilize the invention to advantage. The B1 field distribution of the individual coils in a SENSE imaging array determines the SNR within a target volume of interest (VOI). Others attempted to find optimized SENSE coils by simulating various pre-defined coil topographies. Those methods are restricted by the limited number of coil patterns that could be simulated, and the results will most likely be not the most optimum.

Thus, the illustrated embodiment solves the inverse problem of calculating the probe coil topography, given the target volume and acceleration factor. The SNR in a SENSE-MR image, $SNR_{sense}$, is inversely proportional to the g-factor. One can formulate the g-factor in terms of the magnetic field distribution or sensitivity profiles of the coils. Then, by specifying the geometry of the desired coil former and using finite element mesh (FEM), it is possible to find the surface current distribution to maximize $SNR_{sense}$, in the target volume.

Computer software was developed to calculate optimum coil topography, then the calculated topography is etched on a flexible copper clad circuit board. Electronic circuits were also implemented to interface the probe to the MRI system. Efficacy of this novel probe was tested and verified with experiments.

While the apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112. The invention can be better visualized by turning now to the following drawings wherein like elements are referenced by like numerals.

BRIEF DESCRIPTION OF THE DRAWINGS

FIG. 5a is an axial, full-FOV MR image of the phantom with SENSE optimized coil. FIG. 5b is a sensitivity map of the designed coil calculated by the Biot-Savart law. FIG. 5c is a sensitivity map of the standard rectangular coil, also calculated by the Biot-Savart law.

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE PREFERRED EMBODIMENTS

In the illustrated embodiment, a method for designing MRI RF coil arrays 10 is disclosed that maximizes the $SNR_{sense}$ within a target volume using a target field approach. This method is based on solving the inverse problem of finding a surface current density distribution on a defined coil former 12 using a least squares approach that minimizes $1/SNR_{sense}$. If $g_\rho$ is minimized within the volume of interest by the appropriate coil design, SENSE imaging artifacts will be reduced and SNR will be maximized within that volume.

A coil array 10 is comprised of wires placed on a predefined surface 12 in three dimensional space, which can be approximated by a surface current density $J_s$. It must be understood that the invention expressly contemplates that the predefined surface 12 can be any simple, complex, analytic or nonanalytic shape, but a cylindrical surface 12 was chosen for the illustrated embodiment of FIG. 2a for ease of example. The surface on which $J_s$ flows can be approximated by a finite element mesh (FEM) consisting of flat triangular elements as graphically depicted in FIG. 1, which defines some of the symbol nomenclature below.

For the derivation of the forward problem, we will follow the convention presented in Pissanetzky's article above. In this element, $J_s$ must satisfy the continuity equation, whose solution gives $J_{su}=\partial\sigma/\partial v$, $J_{sv}=-\partial\sigma/\partial u$, where (u,v,w) is the system of coordinates in the plane of the triangle and $\sigma$ is called the stream function. Solution of these equations gives $J_s$:

$$J_s = \frac{1}{2S^e}(\sigma_p \cdot p + \sigma_q \cdot q + \sigma_s \cdot s) \tag{2}$$

Figure 1:
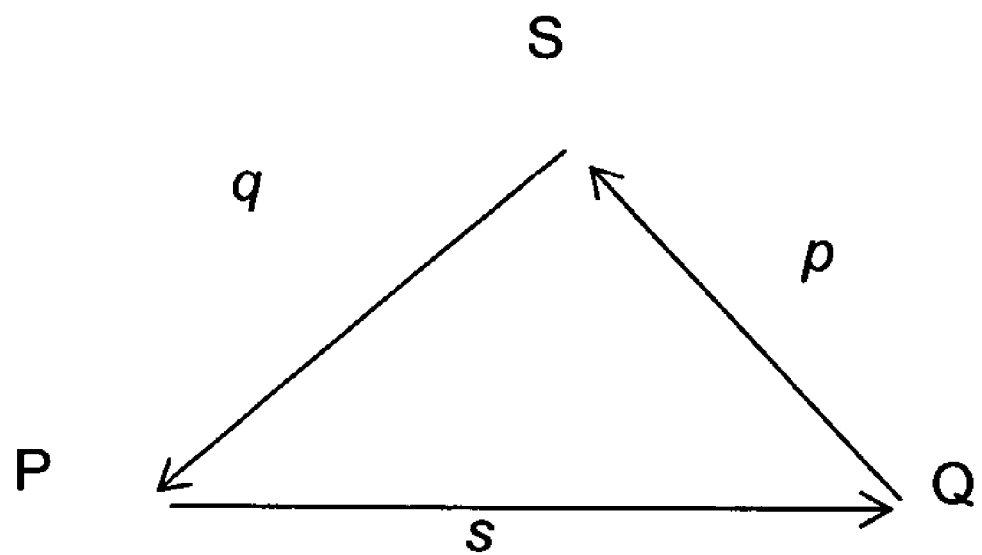
FIG. 1 is a diagram of a triangular element of the finite element mesh used in the method of the invention.

Here, $S^e$ is the area of the triangle and $\sigma_p$, $\sigma_q$ and $\sigma_s$ are the values of $\sigma$ at nodes P, Q, S, respectively of FIG. 1. Using equation 2, one can calculate the magnetic vector potential A and magnetic flux density B generated by $J_s$ at any point in space:

$$B_u^e = \frac{-\mu 0}{4\pi} \cdot J_{sv} \cdot \frac{\partial}{\partial w}\int_{S^e} \frac{dS'}{r} \tag{3}$$

$$B_v^e = \frac{\mu 0}{4\pi} \cdot J_{su} \cdot \frac{\partial}{\partial w}\int_{S^e} \frac{dS'}{r}$$

$$B_w^e = \frac{\mu 0}{4\pi} \cdot \left[ J_{sv} \cdot \frac{\partial}{\partial u}\int_{S^e} \frac{dS'}{r} - J_{su} \cdot \frac{\partial}{\partial v}\int_{S^e} \frac{dS'}{r} \right]$$

Further details were given in Pissanetzky article and will be omitted here to the extent not material to the claimed invention. Using equation 3 and the transformation between the (u,v,w) and the (x,y,z) coordinate systems, the field components $B_x$, $B_y$ and $B_z$ generated by the current density in each element can be calculated. Then, the total B field is determined by summing over all the elements of the mesh. The B field is calculated for a selected number of points on a number of planes within the VOI.

To be able to utilize the target field method in the SENSE coil design, one needs to establish a relationship between the surface current density distribution and $SNR_{sense}$ at each pixel $\rho$. The $SNR_{sense}$ and the g-factor in the $\rho^{th}$ pixel are given by equation 4-5, respectively:

$$SNR_{sense,\rho} = SNR_{full,\rho}/(g_\rho \cdot \sqrt{R}) \tag{4}$$

$$g_\rho = \sqrt{((S^H \cdot \Psi^{-1} \cdot S)^{-1})_{\rho,\rho}(S^H \cdot \Psi^{-1} \cdot S)_{\rho,\rho}} \tag{5}$$

Here, S is the coil sensitivity matrix (H indicates transposed complex conjugate), R is the reduction factor and $\Psi$ is the receiver noise matrix that is approximated by summing the scalar product of coil sensitivities over a number of points inside the VOI:

$$\Psi_{\gamma,\gamma'} = \sum_{i=1}^{N} B_\gamma(r_i) \cdot B_{\gamma'}(r_i) \tag{6}$$

where $B_\gamma(r_i)$ is the field generated by the $\gamma^{th}$ coil at point $r_i$ and $B_{\gamma'}(r_i)$ is the field generated by $\gamma'^{th}$ coil at the same point. Here all coils in array 10 were assumed to be of identical shape, thus the field contribution of $\gamma'^{th}$ coil can be calculated using cylindrical symmetry. Combining equations 4-6, one obtains $SNR_{sense}$ in terms of the coil B fields. $SNR_{full}$ was calculated using the root-sum-of-squares combined pixels. The SNR of the combined image at pixel location $\rho$ is given by:

$$SNR_{c,\rho} = \sqrt{P_\rho^H \cdot \Psi^{-1} \cdot P_\rho} \tag{7}$$

Here, $P_\rho$ is a vector that contains the signals $p_{i,\rho}$ from individual coil elements, which are generated by a single voxel at location $\rho$. In this calculation, it was assumed that the sample noise would be dominant and coil conductor losses and the noise associated with matching circuits and preamplifier were neglected. Uniform conductivity distribution was assumed in the VOI for the calculation of sample noise.

An error term $\epsilon$ is defined, which is the sum of squares of the reciprocal of $SNR_{sense}$ over all pixels within the selected VOI.

$$\varepsilon = \frac{1}{M} \sum_{\rho=1}^{M} \left[ \frac{1}{SNR_{sense,\rho}} \right]^2 \qquad (8)$$

where, M is the number of pixels in the image. The surface current density distribution is obtained by least squares calculation, which will minimize this error term.

A SENSE coil array 10 for small animal imaging has been designed and implemented using the method disclosed above. The surface current distribution on a cylinder 12 with 13 cm diameter was calculated to minimize the g-factor within a 5 cm long, 7 cm diameter cylindrical VOI. Target field values were calculated in 4 planes and 100 points per plane. $SNR_{sense}$ in equation (8) is calculated for a reduction factor of two.

Figure 2A:
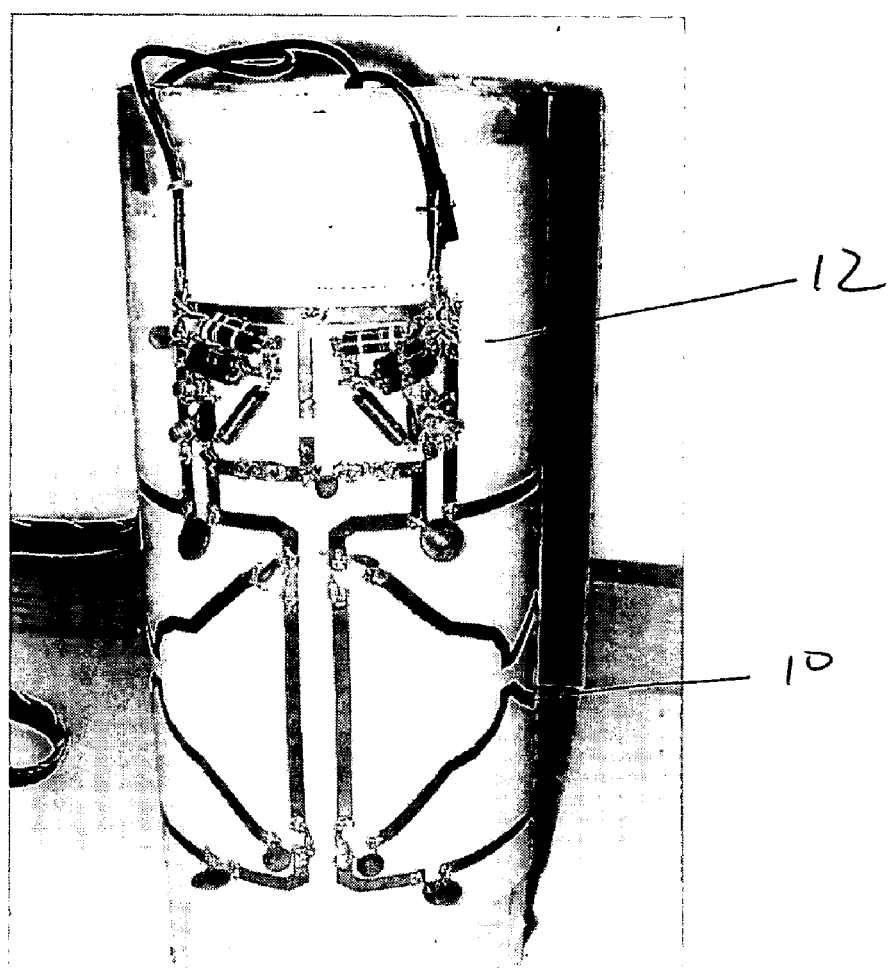
FIG. 2*a* is a photograph of a two-coil SENSE array designed with the target field method.
Figure 2B:
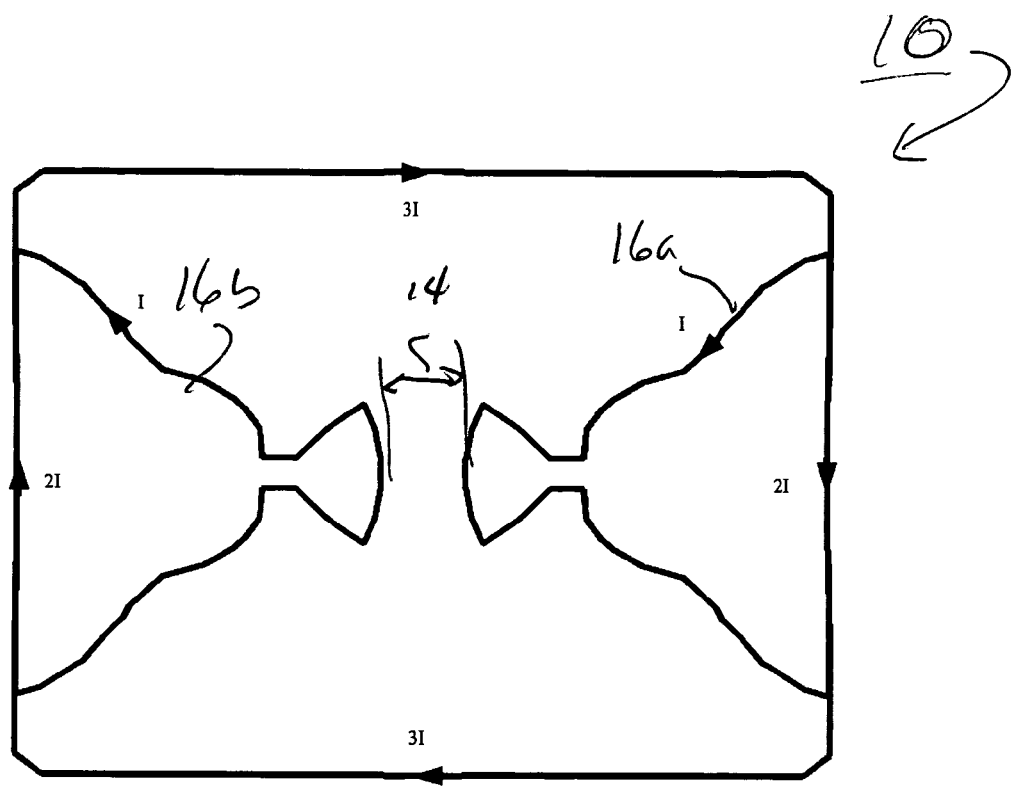
FIG. 2*b* is a diagram of the coil conductor paths for one element of the array of FIG. 1 that is derived from the contour plots shown in FIG. 4*b*.

The algorithm described above minimizes the expression in equation (8) with respect to the stream functions σ, given in equation (2). Note that the current flowing across a segment of the triangular element shown in FIG. 1 is conveniently given by the difference between the components of the stream function on the vertices of that segment. For example, the current that flows across the segment SP will be $\sigma_p - \sigma_s$ (note that the triangular element must be close to an equilateral shape for best accuracy). Therefore, if the contour plot of the stream function is plotted, the contours will form bands of equal current, where each contour line defines the center of the band. The number of these current bands in the plot can be controlled by selecting the number of contours desired in the plot and the continuous current density distribution will be binned into the number of contours selected. In this way, one can simplify the coil structure by reducing the number of contours. A simulation study was done to assess the effects of reducing the number of contours and it is described below. The current flow can be confined within any desired boundaries by setting the nodal values of σ to zero along the boundary. In this way, one coil element will be formed within those boundaries. If there are several contour lines running parallel to each other, those are merged into a single conductor path and relative current distribution in each separate current loop is adjusted by distributed lumped elements. The relative current distributions in our case were confirmed by PSpice™ simulations. In the current implementation, three contour levels were used that resulted in two distinct loops of current as shown in FIGS. 2b and 4b.

The coil array 10 was etched on a flexible copper clad board and wrapped around an acrylic cylinder 12, which was 30 cm long and had 13 cm diameter. Dimensions of each coil element were 13 cm×19.5 cm, with a 0.7 cm gap 14 as shown in FIG. 2b. The array 10 was made up of two coils 16a and 16b whose centers were placed at 3 o'clock and 9 o'clock positions. Isolation between the coils was achieved by a lumped element network. The final coils had S11 around −28 dB and an isolation factor better than −25 dB. The coil was tuned to 64 MHz, the resonance frequency of H1 at 1.5 T MRI scanner. A photograph of the coil array 10 is shown in FIG. 2a.

Figure 3:
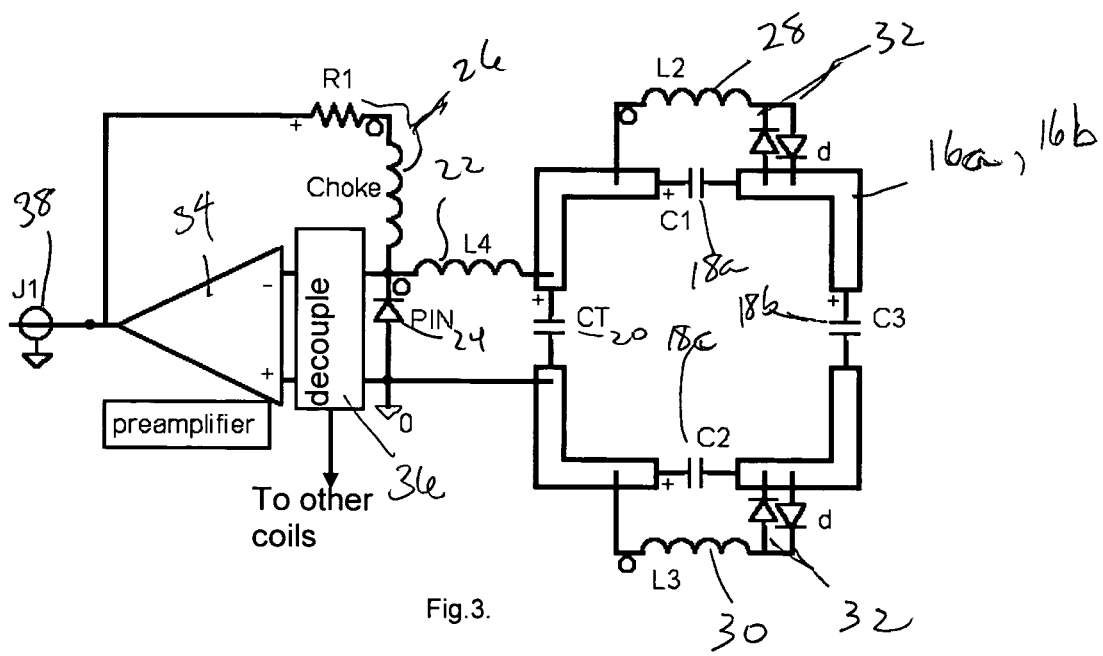
FIG. 3 is a circuit schematic of one coil unit in the proposed SENSE coil design without any representation of the actual coil geometry.

The simplified circuit diagram of one coil unit in this SENSE imaging array 10 is shown in FIG. 3. Here, capacitors 18a-18c are fixed high frequency capacitors (American Technical Ceramics) to tune the coil 16a or 16b to the operating frequency. Capacitor 20 is a non-magnetic variable capacitor (JZ300, Voltronics Inc, Denville, N.J.) for fine-tuning. Capacitor 20 and inductor 22, also form a parallel resonance when PIN diode 24 (MA4P1200, M/Acom, Lowell Mass.) is forward biased through R1-Choke line 26. This parallel resonance shows high impedance and detunes the circuit during high power RF transmit. PIN diode 24 also protects the preamplifier. Inductor 28 and capacitor 18a and inductor 30 and capacitor 18c also forms high impedance parallel tank circuit to improve detuning when passive diode pairs 32 (MA45471, M/ACom) are forward biased by RF power transmitted from volume coil 16a or 16b.

During receive mode, PIN 24 is reverse biased and diodes 32 are open, therefore, the coil 16a, 16b is tuned and receives MRI signals. The preamplifier circuit 34 is designed to have 50Ω input impedance and the decoupling network 36 is added to minimize currents coupled from neighboring coils. DC bias voltage for preamplifier 34 and PIN diode 24 as well as amplified MRI signal all share the same line fed through J1 connector 38.

The finite element mesh gives a discretized approximation of a continuous current distribution with a relatively high spatial resolution. However, it is not practical to build a coil array 10 that will precisely implement the surface current density calculated by the software. The surface current density has to be binned into a small number of conductor loops that will be more practical to build. This binning can be easily implemented by specifying the number of contours in the contour plot function of MATLAB™. Simulation studies were performed with two different numbers of contours; the first one with 100 and the second one with only 3, which was later used to build the coil in the illustrated embodiment.

Figure 4A:
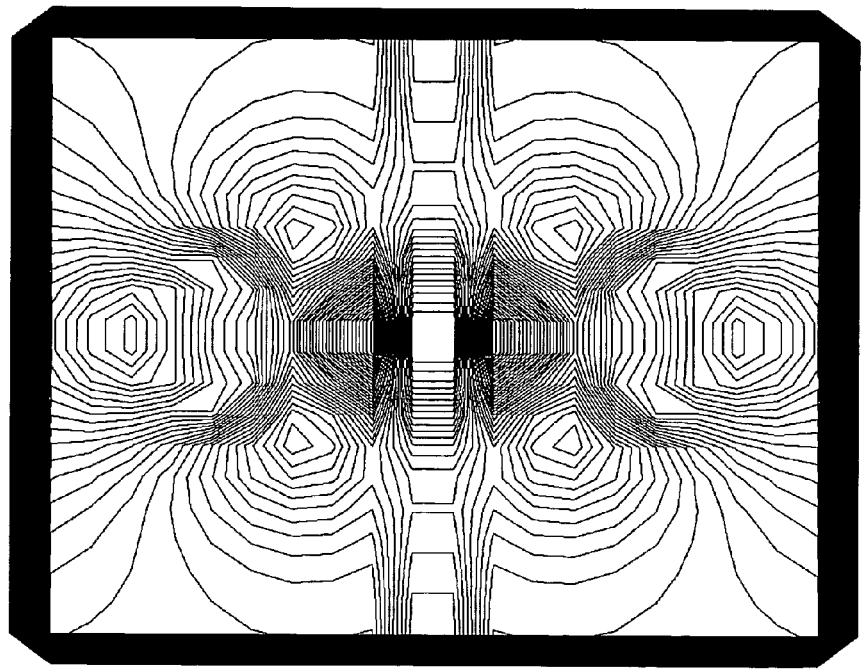
FIG. 4a is a contour plot of the stream function that shows equal current bands at 100 contour levels
Figure 4B:
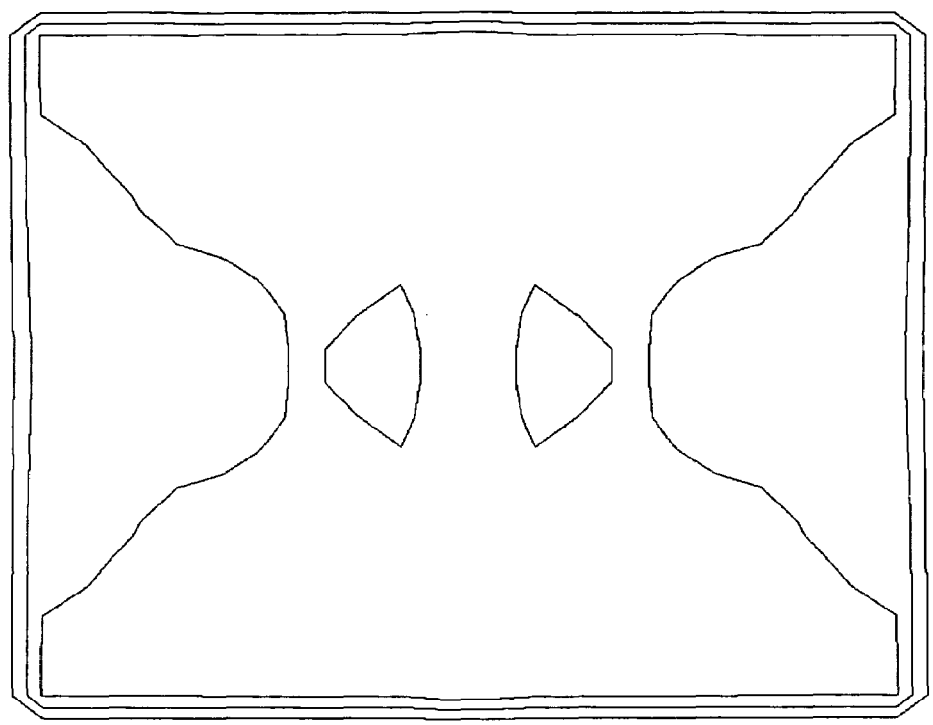
FIG. 4b is a contour plot of the stream function that shows equal current bands at 3 contour levels.

The contour plots of σ with 100 and 3 contours were illustrated in FIGS. 4a-4b. In those plots, the current density that normally flows on one-half of the cylindrical surface is flattened for illustration. The vertical axis of those plots corresponds to the direction of the coil axis.

A standard two-element coil array was simulated for comparison with the coil design 10 of the illustrated embodiment. Rectangular coil elements (not shown), placed on a cylindrical surface of 13 cm diameter were used for simulations. Two different coil configurations were tested. For the first one, each element had an axial length of 9.1 cm, a width of 13.6 cm and a gap of 6.8 cm. These coil dimensions are typical of a standard coil with rectangular elements. The second coil also had rectangular elements but the dimensions were identical to the SENSE optimized coil described above (13 cm×19.5 cm, 0.7 cm gap). The VOI was identical to the one used in the SENSE optimized coil design described above. Between the two coils, the second one resulted in higher mean SNR as well as lower mean and maximum values for g-factor; therefore the second coil simulation was used for comparison.

Figure 5A:
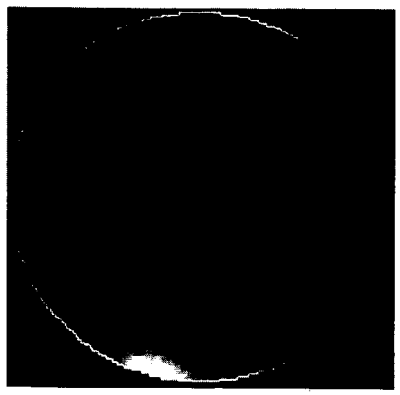
FIGS. 5a-5c are sensitivity maps of the two coil elements in the constructed array which are shown separately side by side.
Figure 5A:
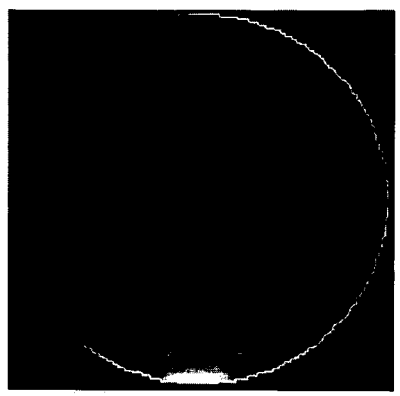

The sensitivity map of the coil array 10 of the illustrated embodiment was measured by imaging a uniform spherical phantom filled with $CuSO_4$ solution as shown in FIG. 5a. The diameter of the phantom was 10 cm and the slice with 7 cm diameter was chosen for display and analysis, similar to the VOI used for the target field. A Philips/Marconi Eclipse 1.5 T system was used for data acquisition. The coil array 10 is placed coaxially with the magnet and an axial MR image was collected using a two dimensional spoiled gradient echo (SPGR) pulse sequence with the following parameters: 5 mm slice thickness, 7 cm FOV and TR=200 ms, TE=6 ms, flip angle=90 and an acquisition matrix of 256×128.

Figure 5B:
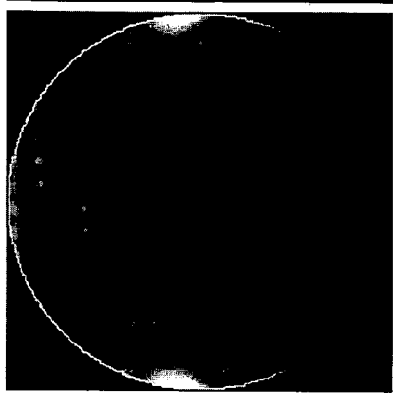
Figure 5B:
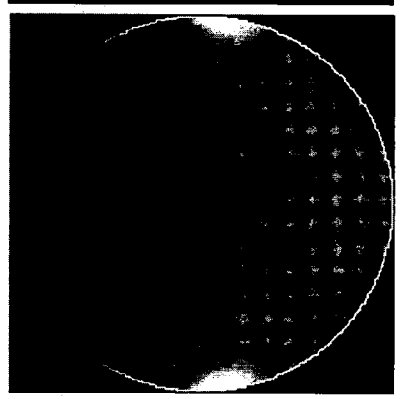
Figure 5C:
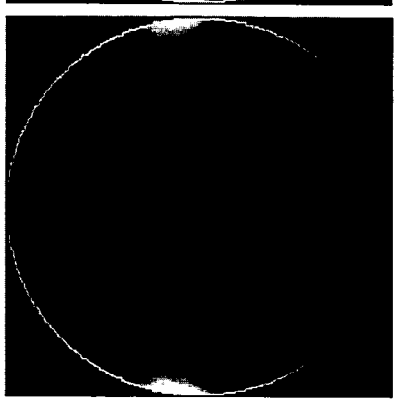
Figure 5C:
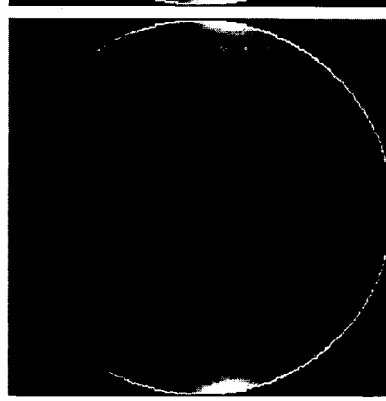
Figure 6:
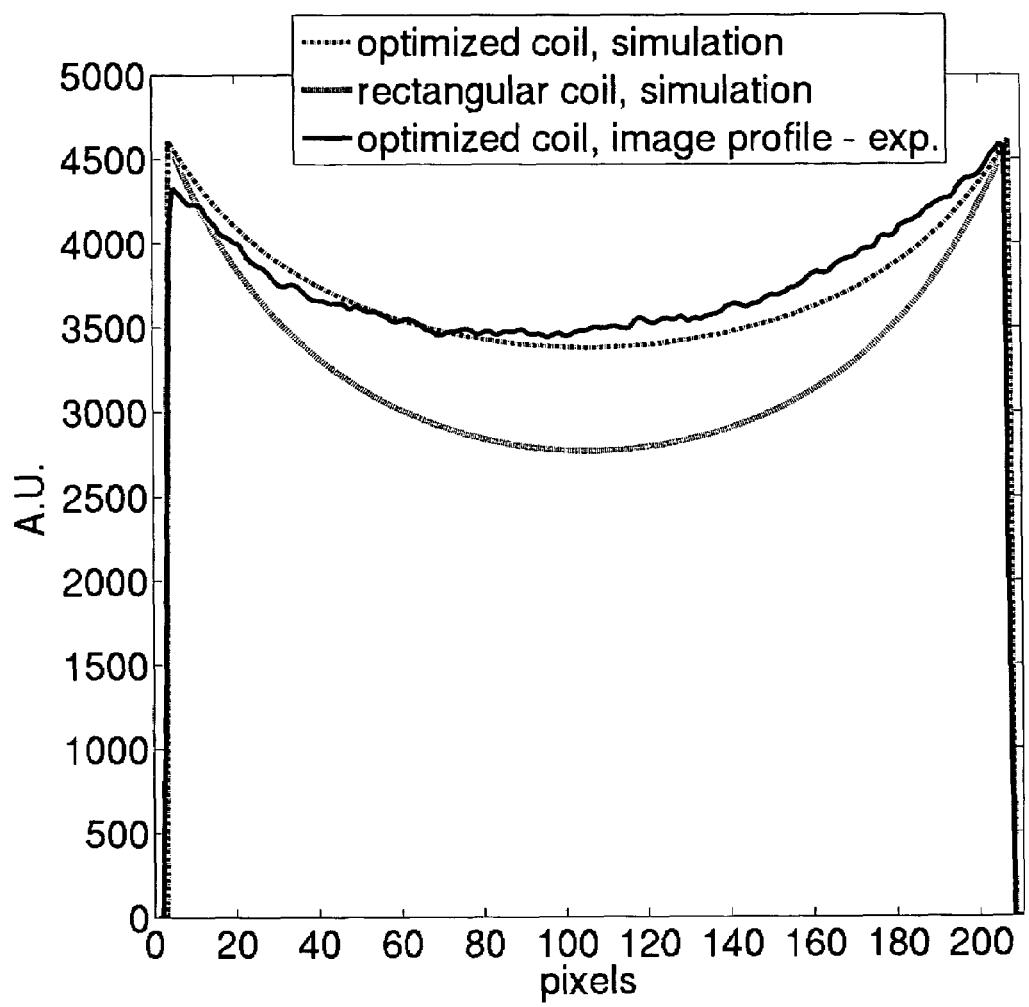
FIG. 6 is a graph of the cross-sectional profiles across the sensitivity maps of the SENSE optimized coil shown in solid line, its simulation result shown in dash-dot line, and the standard rectangular coil shown in hashed line. These profiles are taken from the sensitivity maps shown in FIGS. 5a-5c. The position of the profiles is shown with the dashed line in FIG. 5a. Note that all profiles are normalized with respect to the right edge to display them in the same scale.
Figure 7A:
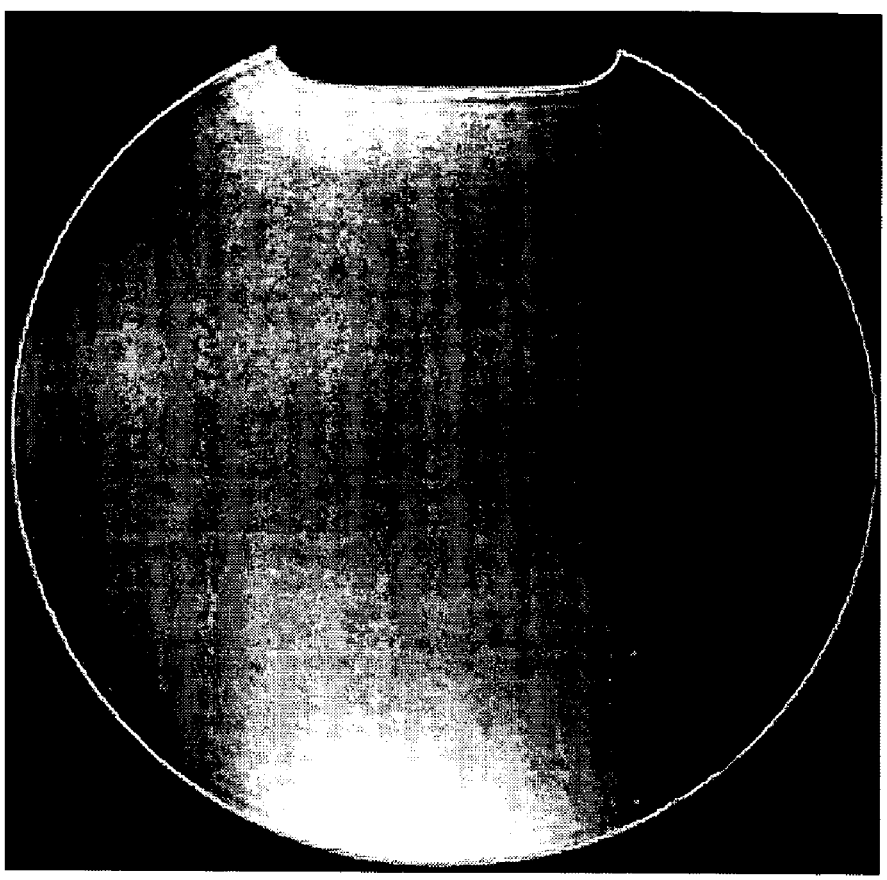
FIG. 7a is a full FOV axial image of the phantom with the constructed SENSE array.
Figure 7B:
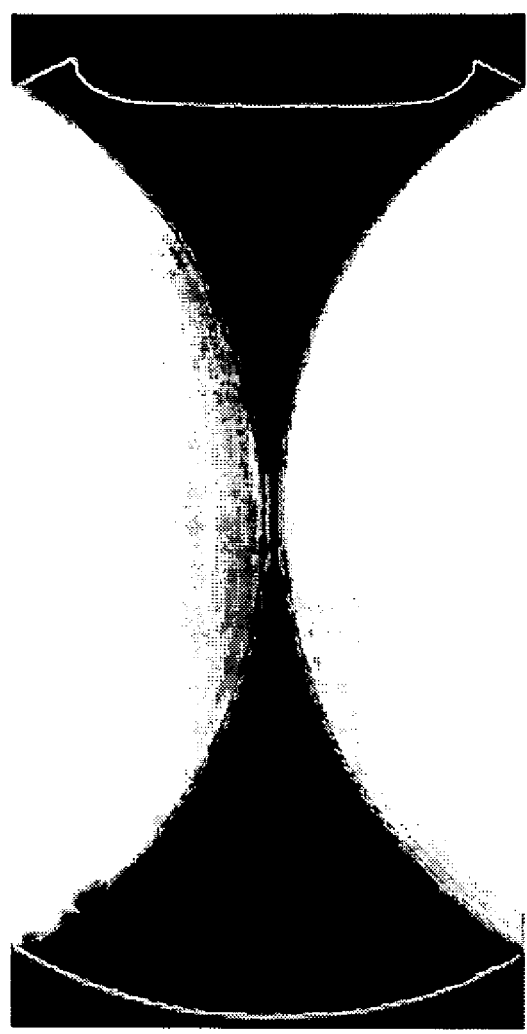
FIG. 7b is an aliased MR image, which is also in the axial plane.
Figure 7C:
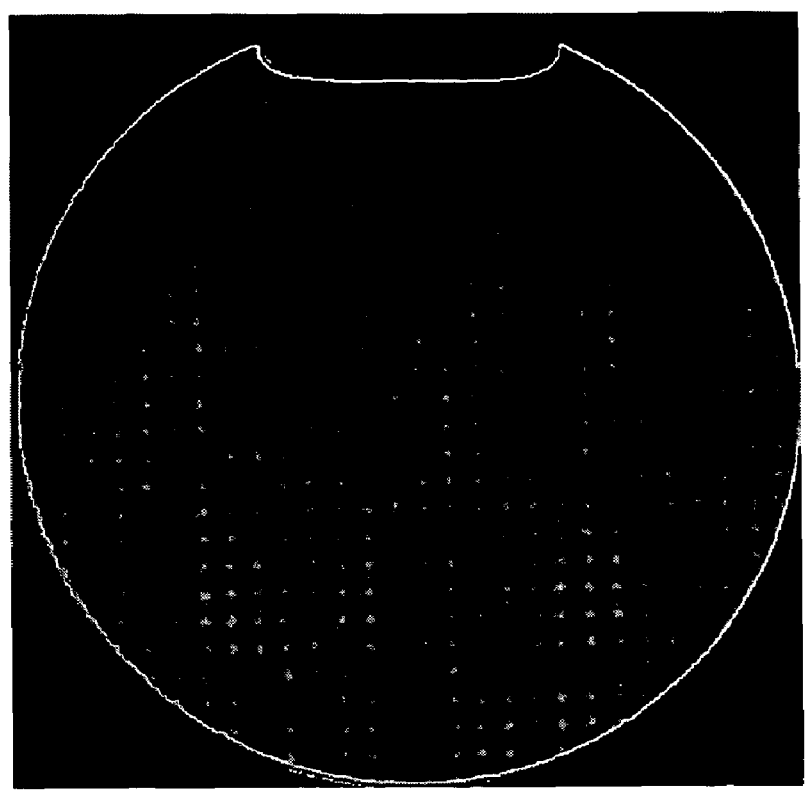
FIG. 7c is a SENSE reconstructed image acquired by the designed coil.

The expected B field of coil array structure of the illustrated embodiment was calculated by Biot-Savart law for comparison and illustrated in FIG. 5b. The sensitivity map of a standard coil of similar geometry with rectangular elements is also calculated and shown in FIG. 5c. Cross-sectional profiles of the designed and standard coil sensitivities as well as the simulation of the designed coil are shown in FIG. 6 to illustrate the improved uniformity of the designed coil compared to the standard design shown in FIG. 5c. The position of this cross section is shown with the dashed line in FIG. 5a; profile was also taken from the same position across FIGS. 5b and 5c. A reduced FOV imaging experiment was also run with the same parameters described above using a reduction factor of two in the phase encode direction. Images were collected from a 7 cm diameter cylindrical phantom and the resulting aliased image and its SENSE reconstructed image are shown in FIG. 7b and 7c, respectively. A full-FOV image was also acquired and shown in FIG. 7a.

The results of the simulations that were carried out to investigate the effect of discretization of the coil conductor loops were summarized in Table 1 below. The table lists the mean, standard deviation, maximum and minimum values for three coils: 1) the one that is constructed; 2) the standard coil with rectangular elements; 3) a coil with 100 current loops, which would represent the current distribution that is calculated by the optimization algorithm more closely. Spatial distribution of $SNR_{sense}$ and g-factor for each coil were calculated using equations 4-7 within the target VOI. Then the mean, maximum, minimum and standard deviations were calculated within the defined VOI and reported in the table. Table 1 summarizes the mean, standard deviation, minimum and maximum values of $SNR_{sense}$ calculated by simulations for the implemented coil, standard coil with rectangular elements and a coil that approximates the calculated surface current density with more current loops.

TABLE 1

| Optimized Coil, 3 contour levels | | Rectangular Element Coil | | Coil loops with 100 contour levels | |
|---|---|---|---|---|---|
| $SNR_{sense}$ | | $SNR_{sense}$ | | $SNR_{sense}$ | |
| mean = | 544.91 | mean = | 470.18 | mean = | 552.09 |
| max = | 748.15 | max = | 701.99 | max = | 737.72 |
| min = | 364.05 | min = | 305.69 | min = | 365.92 |
| std = | 76.55 | std = | 80.20 | std = | 85.03 |
| g-factor | | g-factor | | g-factor | |
| mean = | 1.0363 | mean = | 1.0527 | mean = | 1.018 |
| max = | 1.1867 | max = | 1.1866 | max = | 1.1291 |
| min = | 1 | min = | 1 | min = | 1 |
| std = | 0.03976 | std = | 0.042226 | std = | 0.026872 |

It can be seen from FIGS. 5a-5b that the measured sensitivity maps of the coil array 10 of the illustrated embodiment are in accord with the calculated maps. Improved uniformity of the individual coils 16a, 16b can be seen when the illustrated design in FIG. 5b is compared with the standard design of FIG. 5c. The profiles shown in FIG. 6 also illustrate the improved uniformity within each coil's field pattern. It is seen that the actual measurement closely matches the profile calculated by Biot-Savart law. The profile from actual image with the illustrated coil is slightly skewed, either due to imperfect centering of the phantom or the field profile might have been slightly altered due to its conductivity. However, substantial improvement is evident when compared to rectangular coil's profile.

The average $SNR_{sense}$ within the VOI for the illustrated coil and the standard design were both calculated by simulations for comparison and they were found to be 545 and 470, respectively, for a reduction factor of two (Table 1). This VOI was a cylindrical volume with 7 cm diameter and 5 cm height, as defined in the coil design section. Therefore, roughly 16% increase was achieved in the average SNR within the VOI. When improved uniformity is taken into account, as well as gains in the SNR, this design offers highly efficient coil arrays 10 for parallel imaging.

It can be observed from Table 1 that the mean $SNR_{sense}$ was reduced by only 1.3% when the number of current contour levels was reduced from 100 to 3. On the other hand, the uniformity of SNR within the VOI seems to have improved when the number of contours was reduced, as evidenced by smaller standard deviation. The coil with 100 level contours has the smallest g-factor among all three, as well as the best uniformity.

This basic algorithm minimized the squared $1/SNR_{sense}$, averaged over the whole imaging volume. Since $SNR_{sense}$ is the ratio of $SNR_{full}$ to the g-factor, this approach simultaneously tried to maximize $SNR_{full}$ and minimize the average g-factor. This can be seen from the values of g-factors and $SNR_{sense}$ for three coil structures listed in Table 1. Although the algorithm reduced the mean and maximum g-factor values, a larger improvement in SNR was observed. Therefore it can be concluded that the algorithm did not just attempt to reduce the g-factor but also increased the coil sensitivity within the VOI.

One can also add weighted average of the g-factor, $\lambda \cdot \|g(\rho)\|$, to the cost function in equation (8). By changing the weighting factor $\lambda$, it is possible to put more emphasis on minimizing the average g-factor. Similarly, one can add weighted standard deviation of g-factor to improve the uniformity of $g(\rho)$, hence spatially more uniform $SNR_{sense}$ can be achieved. It may also be possible to use a de-emphasizing/emphasizing method to improve areas of low SNR, trading off areas where SNR is more than needed.

It must be noted that the optimization is performed for a specific reduction factor. Optimum current density distribution can be different for different reduction factors. It may be possible to optimize the surface current density for a range of reduction factors instead of a specific value.

In summary, the performance of the illustrated coil design was compared with that of standard coil arrays made up of rectangular elements, which are most commonly found in the literature. To the best of our knowledge, arbitrary coil geometries that optimize coil performance have not been reported previously.

The invention was tested in the illustrated embodiment of a simple 2-coil, cylindrical structure and preliminary results demonstrate the advantage of using target field method in SENSE array coil designs. However, using the same technique, more complicated arrays with increased number of coils and reduction factors can easily be designed. Moreover, the geometry of the coil can be any arbitrary shape, e.g. one that wraps tightly around a body part.

Quasi static field calculations were used in illustration disclosed above. More accurate results can be obtained by full wave calculations using a numerical technique such as finite difference time domain. This would take into account the interaction of B1 field with tissues.

In summary, the inverse problem which is practiced by methodology of the invention begins with assuming a surface shape on which the coil will be formed. The B1 field pattern in a volume of interest, the g factor or sensitivity profile of the coil, and the SNR are related to each other. By maximizing SNR for a given surface shape for the coil, the optimal B1 field pattern in the volume of interest can be determined. Once the optimal B1 field pattern is determined, the surface current density pattern on the surface shape in a finite mesh analysis can be determined from which the current paths which that coil should provide by means of its topography, i.e. the pattern of the sense coil, in order to optimize SNR is realized. In other words it is not necessary to guess at what kind of coil pattern on the coil former is needed to give the best SNR for that coil former and the volume of interest, but the method produces the optimal coil pattern to be used in the circumstances.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following invention and its various embodiments.

Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations. A teaching that two elements are combined in a claimed combination is further to be understood as also allowing for a claimed combination in which the two elements are not combined with each other, but may be used alone or combined in other combinations. The excision of any disclosed element of the invention is explicitly contemplated as within the scope of the invention.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

We claim:

1. A method of manufacturing an optimized coil having a signal-to-noise ratio for an MRI scanner comprising:
   determining a magnetic field in a volume of interest which maximizes the signal-to-noise ratio for the MRI scanner in the volume of interest;
   determining by means of calculation a topology of a current distribution on a predetermined surface that is capable of providing a magnetic field that approximates or equals the determined magnetic field; and
   providing a coil with the topography of the determined current distribution.

2. The method of claim 1 where determining the current distribution comprises:
   defining a finite element mesh on a coil frame of reference of the predetermined surface; and
   determining a surface current density in the finite element mesh on the coil frame which surface current density is induced from the B1 field within the volume of interest.

3. The method of claim 2 where determining the surface current density in the finite element mesh on the coil frame which surface current density is induced from the B1 field within the volume of interest further comprises identifying a volume of interest and specifying a $SNR_{sense}$ over the volume of interest from which the B1 field in the volume of interest is determined and upon which the surface current density is determined.

4. A method of manufacturing an optimized coil having a signal-to-noise ratio for an MRI scanner comprising;
   determining a magnetic field in a volume of interest which maximizes the signal-to-noise ratio for the MRI scanner in the volume of interest;
   determining a topology of a current distribution on a predetermined surface that is capable of providing a magnetic field that approximates or equals the determined magnetic field; and
   providing a coil with the topography of the determined current distribution,
   where determining the current distribution comprises:
      defining a finite element mesh on a coil frame of reference of the predetermined surface; and
      determining a surface current density in the finite element mesh on the coil frame which surface current density is induced from the B1 field within the volume of interest
   where determining the surface current density in the finite element mesh on the coil frame which surface current density is induced from the B1 field within the volume of interest further comprises identifying a volume of interest and specifying a $SNR_{sense}$ over the volume of interest from which the B1 field in the volume of interest is determined and upon which the surface current density is determined,
   where determining a B1 field comprises generating a corresponding acceleration factor, g, or sensitivity profile in a probe coil from magnetic B1 field distribution in the volume of interest and minimizing the acceleration factor, g, in the volume of interest so that $SNR_{sense}$ will be maximized in the volume of interest and from which minimized acceleration factor, g, the surface current density is determined.

5. A method of manufacturing an optimized coil having a signal-to-noise ratio for an MRI scanner comprising:
    determining a current distribution on a predetermined surface that maximizes the signal-to-noise ratio within a volume of interest; and
    providing a coil topography for the optimized coil with the determined current distribution given the volume of interest and determined current distribution,
    where the predetermined surface is a coil former and where providing the coil topography comprises using a finite element mesh to determine the surface current distribution to maximize $SNR_{sense}$, in the volume of interest given a probe coil positioned on the coil former.

6. A method of manufacturing an optimized coil having a signal-to-noise ratio for an MRI scanner comprising:
    determining a current distribution on a predetermined surface that maximizes the signal-to-noise ratio within a volume of interest; and
    providing a coil topography for the optimized coil with the determined current distribution given the volume of interest and determined current distribution,
    where providing a coil topography comprises etching an optimized probe coil on a flexible copper clad circuit board and providing electronic circuits coupled to the circuit board to interface the optimized probe coil to an MRI system.

7. An optimized MRI RF sensing coil signal-to-noise ratio lying on a predetermined surface characterized by a geometric topology determined from a calculated current distribution which maximizes the signal-to-noise ratio in the coil corresponding to a volume of interest, the geometric topological structure of the coil being defined by: determining a magnetic field in a volume of interest which maximizes the signal-to-noise ratio for the MRI scanner in the volume of interest; determining by means of calculation a topology of a current distribution on a predetermined surface that is capable of providing a magnetic field that approximates or equals the determined magnetic field; and providing a coil with the topography of the calculated determined current distribution.

8. The coil of claim 7 where the geometric topological structure of the coil determined from a current distribution comprises a conductor pattern characterized by a surface current density which is defined in a finite element mesh in a coil frame of reference, which pattern of surface current density generates a B1 field within the volume of interest, which B1 field maximizes the signal-to-noise ratio (SNR) within the volume of interest.

9. The coil of claim 8 where the conductor pattern is characterized by sensitivity to a B1 field which corresponds to a $SNR_{sense}$ over the volume of interest and which $SNR_{sense}$ corresponds to an acceleration factor, g, or sensitivity profile of the coil in the volume of interest and the acceleration factor, g, being minimized in the volume of interest so that $SNR_{sense}$ will be maximized in the volume of interest and with which minimized acceleration factor, g, the conductor pattern is determined.

10. The coil of claim 8 where the geometric topology of the coil is defined on a predetermined coil former and where the conductor pattern is derived from sensitivity to a B1 field which corresponds to a $SNR_{sense}$ over the of interest using the finite element mesh to determine the surface current distribution to maximize the $SNR_{sense}$, in the volume of interest.

11. A method for designing an MRI RF sense coil comprising:
    selecting a surface shape on which the coil is to be formed;
    selecting a maximum signal-to-noise ratio SNR for the coil;
    determining a B1 field pattern in a volume of interest corresponding to the selected signal-to-noise ratio SNR for the coil;
    determining by means of calculation a surface current density pattern from the determined B1 field pattern on the surface shape using a finite mesh analysis;
    determining a structural topology for the sense coil needed to allow the determined surface current density pattern induced by the determined B1 field needed to optimize SNR; and
    manufacturing the sense coil with the determined structural topology.

12. A method for designing an MRI RF sense coil comprising:
    selecting a fixed surface shape for the coil to match at least a portion of a body organ;
    selecting a maximum signal-to-noise ratio (SNR) for the coil for the portion of a body organ given the shape of the portion of a body organ;
    determining a B1 field pattern in the portion of a body organ corresponding to the maximized signal-to-noise ratio SNR for the coil;
    determining by means of calculation a surface current density pattern from the determined B1 field pattern on the surface shape using a finite mesh analysis;
    determining a structural topology for the sense coil needed to allow the determined surface current density pattern induced by the determined B1 field which optimizes SNR; and
    manufacturing the sense coil with the determined structural topology.

13. The method of claim 12 where the MRI RF sense coil is a multiple coil assembly used for parallel MRI sensing or accelerated SENSE imaging and
    where selecting a surface shape for the coil, maximizing a signal-to-noise ratio (SNR), determining a B1 field pattern, determining a surface current density pattern and determining a structural topology of the sense coil comprises selecting a surface shape for the multiple coil assembly, maximizing a signal-to-noise ratio (SNR) for the multiple coil assembly, determining a B1 field pattern for the multiple coil assembly, determining a surface current density pattern for the multiple coil assembly and determining a structural topology for the multiple coil assembly.

14. A computer program product including instructions stored in a computer readable medium and used to control operation of a computer for use in manufacturing an optimized coil having a signal-to-noise ratio for an MRI scanner, the computer program product comprising instructions for:
    determining a magnetic field in a volume of interest which maximizes the signal-to-noise ratio for the MRI scanner in the volume of interest; and
    determining by means of calculation a topology of a current distribution on a predetermined surface that is capable of providing a magnetic field that approximates or equals the determined magnetic field.

15. A computer program product including instructions stored in a computer readable medium and used to control operation of a computer for use in manufacturing an MRI RF sense coil, the computer program product comprising instructions for:
- selecting a surface shape on which the coil is to be formed;
- selecting a maximum signal-to-noise ratio SNR for the coil;
- determining a B1 field pattern in a volume of interest corresponding to the selected signal-to-noise ratio SNR for the coil;
- determining by means of calculation a surface current density pattern from the determined B1 field pattern on the surface shape using a finite mesh analysis; and
- determining a structural topology for the sense coil needed to allow the determined surface current density pattern induced by the determined B1 field needed to optimize SNR.

16. A computer program product including instructions stored in a computer readable medium and used to control operation of a computer for use in manufacturing an MRI RF sense coil, the computer program product comprising instructions for:
- selecting a fixed surface shape for the coil to match at least a portion of a body organ;
- selecting a maximum signal-to-noise ratio (SNR) for the coil for the portion of a body organ given the shape of the portion of a body organ;
- determining a B1 field pattern in the portion of a body organ corresponding to the maximized signal-to-noise ratio SNR for the coil;
- determining by means of calculation a surface current density pattern from the determined B1 field pattern on the surface shape using a finite mesh analysis; and
- determining a structural topology for the sense coil needed to allow the determined surface current density pattern induced by the determined B1 field which optimizes SNR.

17. A computer program product including instructions stored in a computer readable medium and used to control operation of a computer for use in manufacturing an MRI RF sense coil, the computer program product comprising instructions for:
- determining a current distribution on a predetermined surface that maximizes the signal-to-noise ratio within a volume of interest; and
- providing by means of calculation a coil topology for the coil with the determined current distribution using a finite element mesh to determine the surface current distribution to maximize $SNR_{sense}$, in the volume of interest and with the coil to be positioned on a predetermined coil former of fixed shape.

18. A computer program product including instructions stored in a computer readable medium and used to control operation of a computer for use in manufacturing an MRI RF sense coil, the computer program product comprising instructions for:
- determining by means of calculation a current distribution on a predetermined surface that maximizes the signal-to-noise ratio within a volume of interest; and
- etching a coil topology for the optimized coil with the determined current distribution given the volume of interest and the determined current distribution on a flexible copper clad circuit board.

* * * * *